United States Patent [19]

Feuerbaum

[11] Patent Number: 4,683,376
[45] Date of Patent: Jul. 28, 1987

[54] OPPOSING FIELD SPECTROMETER FOR ELECTRON BEAM MENSURATION TECHNOLOGY

[75] Inventor: Hans-Peter Feuerbaum, Munich, Fed. Rep. of Germany

[73] Assignee: ICT Integrated Circuit Testing Gesellschaft, fuer Halbleiterprüftechnik mbH, Fed. Rep. of Germany

[21] Appl. No.: 773,863

[22] Filed: Sep. 9, 1985

[30] Foreign Application Priority Data

Sep. 18, 1984 [DE] Fed. Rep. of Germany ....... 3434231

[51] Int. Cl.⁴ ............................................. G01N 23/00
[52] U.S. Cl. .................................. 250/309; 250/310; 324/158 R
[58] Field of Search ............... 250/305, 309, 310, 397; 324/158 R

[56] References Cited

U.S. PATENT DOCUMENTS

| | | |
|---|---|---|
| 3,694,652 | 9/1972 | Banburg et al. ..................... 250/310 |
| 3,845,305 | 10/1974 | Liebl et al. ......................... 250/310 |
| 3,961,190 | 6/1976 | Lukianoff et al. ............... 324/158 R |
| 4,097,738 | 6/1978 | Feue et al. .......................... 250/305 |
| 4,442,355 | 4/1984 | Tamura et al. ..................... 250/310 |
| 4,464,571 | 8/1984 | Plics .................................. 250/305 |

Primary Examiner—Bruce C. Anderson
Attorney, Agent, or Firm—Hill, Van Santen, Steadman & Simpson

[57] ABSTRACT

An electrostatic opposing field spectrometer has an extraction electrode (AN) and an opposing field electrode arrangement with a pair of planar opposing field electrodes (EG1 and EG2) mounted to an outer electrode part (EM) at either end of a truncated conical shaped bore extending therethrough, where the smaller opening of the bore is in the direction of the extraction electrode (AN). The planar opposing field electrodes (EG1 and EG2), in conjunction with the bore surface, generates substantially spherical equi-potential lines (A1 and A2) which transmit a larger solid angle distribution of secondary electrons (SE) triggered at a measuring point (M) on the specimen surface (PR).

11 Claims, 3 Drawing Figures

OPPOSING FIELD SPECTROMETER FOR ELECTRON BEAM MENSURATION TECHNOLOGY

BACKGROUND OF THE INVENTION

1. Field of the Invention

The present invention relates generally to an opposing field spectrometer of the type which may be utilized to undertake measurements utilizing an electron beam probe and, more specifically, to an opposing field electrode arrangement for generating spherically symmetrical potential lines.

2. Description of the Prior Art

The use of electron beam mensuration technology to conduct voltage measurements at various test points on the surface of a specimen, such as voltage measurements at interconnects and circuit nodes of integrated microelectronic components, requires the use of a spectrometer for secondary electrons.

In such an electron beam mensuration technology, the test points to be measured on a specimen surface are irradiated with a beam of primary electrons, causing the release or emission of secondary electrons. Depending upon the voltage which is present at the test point, the energy distribution function of the secondary electron is altered. This change in the energy distribution function of the secondary electrons can be determined by a spectrometer for detecting such secondary electrons, and thus the voltage which is present at the test point can be ascertained.

An opposing field spectrometer for use in electron beam mensuration technology is disclosed in U.S. Pat. No. 4,460,866.

An electrostatic opposing field spectrometer is described in an article by H. P. Feuerbaum "VLSI Testing Using the Electron Probe" Scanning Electron Microscopy, 285-296, (1979), I. The opposing field spectrometer disclosed therein, however, cannot transmit the entire solid angle distribution of the secondary electrons triggered at the measuring point on the specimen surface, which results in measuring errors primarily from the fact that the electrons obliquely impacting the planar opposing field network can not pass the opposing field lattice under certain conditions, whereas an electron of the same energy moving perpendicular to the opposing field network can pass the opposing field network.

Plies U.S. Pat. No. 4,464,571 discloses an electrostatic opposing field spectrometer having an extraction electrode and an opposing field electrode formed of two spherically symmetrical electrode elements which generate a spherically symmetrical opposing field. This arrangement of opposing field electrodes takes into consideration the solid angle distribution of the secondary electrons triggered at a test point on the specimen surface. The spherically symmetrical electrodes each have a radius of curvature such that the centers are disposed in a plane containing an imaginary source point for the secondary electrons. While the device disclosed in the Plies patent permits transmission of the solid angle distribution of the secondary electrons, it is difficult and involved to manufacture, particularly do to the spherically symmetrical electrodes.

SUMMARY OF THE INVENTION

An object of the present invention is to provide an electrostatic opposing field spectrometer which accomodates the solid angle distribution of the secondary electrons triggered at a measuring point, and which can be manufactured in relatively simple fashion.

The above object is inventively achieved in an electrostatic opposing field spectrometer having an opposing field electrode arrangement that includes an extraction electrode and at least one essentially planar opposing field electrode at the edges of which is an outer electrode. The outer electrode, which may be formed of one or several parts, defines an opening having an inside wall. The inside wall of the opening is constricted in the direction of the extraction electrode so that the constricted portion is closer to a primary electron beam passing through the opening.

In the prior art opposing field spectrometers that have essentially planar opposing field electrodes, the equipotential lines of the opposing field are likewise planar. In the present invention, the spacing of the electrode parts from the primary electron beam causes the opposing field equipotential lines to be curved rather than planar so that the angular distribution of the secondary electron is taken into consideration.

In a preferred embodiment, the outer electrode is solid and has a centrally located bore. The bore is preferably of a circular truncated cone shape and defines a smaller and a larger opening in opposite faces of the outer electrode, and the electrode face having the smaller opening is disposed in the direction of an extraction electrode which is to be placed adjacent a specimen being tested. The inside surface or wall of the bore preferably a 45° angle with the primary electron beam.

Preferably a pair of planar opposing field electrodes are disposed at the opposite electrode faces over the respective openings of the bore. During operation of the device, nearly spherically symmetrical opposing field lines are generated. The present device is relatively easy to manufacture and supplies greater energy resolution than do the devices of the prior art. The present device thus offers the advantage of detecting a greater angular distribution of secondary electrons while avoiding the use of the relatively difficult to manufacture spherical opposing field electrodes.

The outer electrode limits the paths of backscatter electrons during use of the device. Backscatter electrons can ordinarily proceed to the portion of the spectrometer in which the detector opening is situated which can falsify the measured signal. In the present arrangement, however, the backscatter electrons are prevented from reaching the detector, resulting in a more accurate measured signal.

The outer electrode may consist of one part or of several parts and, when the part, or parts, are formed of solid material, the present electrode arrangement provides improved definitions of the potential distribution of the opposing field.

It is foreseen that the central bore in the outer electrode need not be circular, but instead the bore can be shaped so that geometrical pecularities of the spectrometer-detector arrangement can be taken into consideration.

DESCRIPTION OF THE PREFERRED EMBODIMENTS

Figure 1:
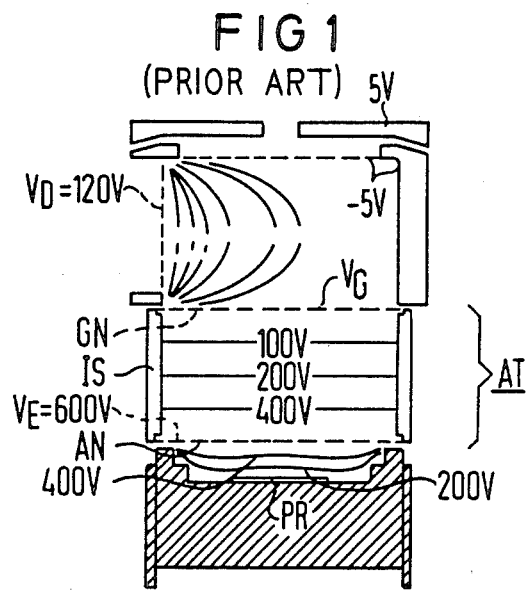
FIG. 1 is a side view of a conventional secondary electron spectrometer of the type which is known in the art.

A conventional opposing field spectrometer of the type which is disclosed in the H. P. Feuerbaum article identified above is shown in FIG. 1. This conventional spectrometer has an extraction network AN, an opposing field network GN, and an insulator IS. These elements comprise a portion AT of the spectrometer which is replaced by a part ET3 which comprises the inventive features of the present invention as more fully described in conjunction with FIG. 2.

Given an opposing field spectrometer of FIG. 1 having an opposing field network GN comprising a mesh width of 250 micrometers and a central bore for the primary electron beam having a diameter of 0.5 mm, a potential of 600 volts adjacent the extraction network AN and a potential of 0 volts adjacent the opposing field network GN, then a maximum field strength of 30 volts is measured in the central bore provided for the primary electron beam. Thus, given the stated potentials and dimensions, such secondary electrons which cannot overcome the potential barrier of 600 volts which is present between the extraction network AN and an opposing field network GN and still be documented by the detector; these secondary electrons only being capable of overcoming the difference between the potential of 600 volts at the extraction network AN and the potential of 30 volts in the central bore of the opposing field network GN for the primary electron beam. This results in errors in the measured results and relatively poor energy resolution.

If the planar opposing field network GN in the opposing field spectrometer of FIG. 1 were replaced by two parallel planar opposing field networks each having a mesh width of 250 micrometers and the central bore diameter of 0.5 mm and if these two parallel opposing field networks were spaced 1 mm from one another and held at a potential of 0 volts with the extraction electrode at a potential of 600 volts, a maximum field strength of 4 volts could still be measured in the central bores of the two parallel opposing field networks. Thus, there would still be poor energy resolution and errors in the measured results. Outside of the central bores of the two parallel opposing field networks the equal potential lines would essentially lie parallel to one another.

Figure 2:
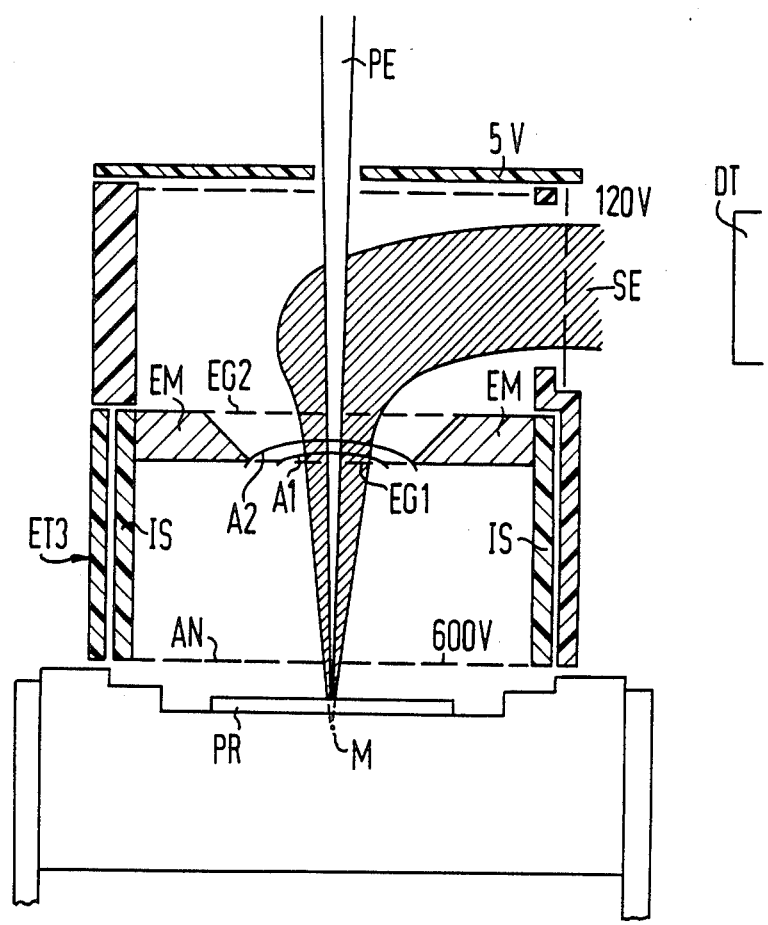
FIG. 2 is a cross-sectional view of an opposing field spectrometer constructed in accordance with the principles of the present invention.

FIG. 2 shows one embodiment of an electrostatic opposing field spectrometer of the present invention. The part AT of FIG. 1 has been replaced by the part ET3 shown in FIG. 2 for operation in the same manner and at the same voltages. A practically spherically symmetrical opposing field is generated between two parallel planar opposing field networks EG1 and EG2.

The present opposing field electrode arrangement includes a solid outer electrode part EM having a shaped bore therethrough, preferably of truncated conical shape. The smaller opening of this shaped bore is directed toward the extraction electrode AN and is provided with the planar opposing field network EG1. A larger opening of this shaped bore is directed toward the primary electron beam source and is provided with the planar opposing field network EG2. Each planar network EG1 and EG2 comprises a mesh width of 250 micrometers and has a centrally located bore therethrough having a diameter of 1.5 mm. The extraction electrode AN and the opposing field electrode arrangement are separated by an isolator IS.

In the preferred embodiment, the solid outer electrode part EM is formed of gold-plated bronze. The two planar opposing field networks EG1 and EG2 are each formed of gold-plated copper. The solid outer electrode part EM and the planar opposing field networks EG1 and EG2 are all connected to lie at the same potential during operation of the device. The solid outer electrode part EM has an outside diameter of approximately 8 mm, a height of approximately 1 mm, a smaller opening of the bore of approximately 3 mm and a larger opening of the bore of approximately 6 mm. The diameter of the first planar opposing field network EG1 is equal to the diameter of the smaller opening, 3 mm. The diameter of the second planar opposing field network EG2 is the same as the diameter of the larger opening of the bore, 6 mm. The generated surface at the inside of the truncated conical shape bore describes an angle of 45° to the direction of a primary electron beam PE.

Equi potential lines A1 and A2 generated inside the opposing field electrode arrangement are practically spherically symmetrical, in the ideal case, relative to a virtual source point M of secondary electrons SE so that the secondary electrons proceed practically parallel to the field lines irrespective of their angular distribution.

The advantageous effect of an opposing field spectrometer of the present invention is achieved in that the spacing of the bore wall from the primary electron beam PE is reduced in the direction toward the extraction electrode AN. The essential advantages of an opposing field electrode arrangement of the present invention are thereby established. These advantages are maintained when the opposing field electrodes EG1 and EG2 are non-planar, but rather are formed with slight arcs.

Instead of using the two opposing field electrodes EG1 and EG2, one or a plurality of opposing field electrodes could also be provided associated with the bore of the outer electrode part EM.

An important feature of the present invention is that the inside bore wall of the outer electrode part EM comprise a metallic part lying at the same potential as the outer electrode part EM. Without such metallic parts in the inside of the bore of the outer electrode part EM, a maximum field strength for about 50 or 60 volts would be measured inside the opposing field electrode arrangement which would result in correspondingly unfavorable effects on the measured results and on the energy resolution. In the device of the present invention, it is important that the maximum field strength inside the opposing field network arrangement is lower than in the opposing field electrode arrangements of the prior art, which do not have reduced electrode part spacings with respect to the primary electron beam in the direction of the extraction electrode AN.

In an opposing field electrode arrangement of the present invention, the maximum field strength in the inside of the opposing field electrode arrangement is reduced by a factor of 15 in comparison with that of the prior art shown in FIG. 1. This results in an improvement in energy resolution by a factor of between 200 and 250.

Figure 3:
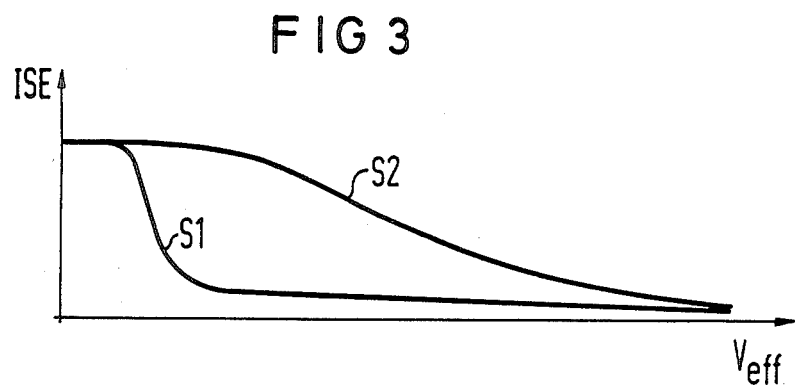
FIG. 3 is a graph showing the advantageous effect of the electrostatic opposing field spectrometer of the present invention over that of the prior art.

FIG. 3 illustrates the advantageous effects of the present opposing field spectrometer. The spectrometer characteristic of the present invention are shown at S1 and the spectrometer characteristic of a spectrometer of the prior art is shown at S2. $V_{EFF}$ is the potential barrier between the measuring point and the potential of the equal potential lines A2. The potential of the equal potential line A2 is set by the potential of the opposing field electrode arrangement so that the low energy secondary electrons which have been influenced by local fields on a specimen PR do not proceed to a detector DT. A variable ISE is the secondary electron measured signal which is obtained from the current of the secondary electrons SE which have overcome the potential barrier between the potential at the measuring point and the potential of the equal potential line A2 and thereafter proceed to the detector DT.

The spectrometer characteristic S1 for a spectrometer of the present invention drops rather steeply within a small range of $V_{eff}$. The spectrometer characteristic S2 has a relatively smooth slope or drop in a relatively greater range of $V_{eff}$. In an opposing field spectrometer of the present invention, thus, the potential of a measuring point can be identified with far greater precision than with an opposing field spectrometer of the prior art. The energy resolution of the present invention is thus significantly greater than with the prior art opposing field spectrometers.

Although modifications and changes may be suggested by those skilled in the art, it is the intention of the inventor to embody within the patent warranted hereon all changes and modifications as reasonably and properly come within the scope of his contribution to the art.

I claim as my invention:

1. An electrostatic opposing field spectrometer having a primary beam for generating secondary particles when focused on a specimen, comprising:
   an extraction electrode and
   an opposing field electrode arrangement wherein said opposing field electrode arrangement includes at least one essentially planar opposing field electrode, and
   wherein said opposing field electrode arrangement, so as to accommodate the angular distribution of secondary particles, includes
   an outer electrode part arranged at the edge of said at least one essentially planar opposing field electrode, said outer electrode part has an inside wall at the edge of said at least one essentially planar opposing field electrode wherein said inside wall is closer to the primary beam at a portion toward said extraction electrode and spaced farther from the primary beam at a portion away from said extraction electrode.

2. An electrostatic opposing field spectrometer as claimed in claim 1, wherein said at least one essentially planar opposed field electrode is a net electrode.

3. An electrostatic opposing field spectrometer as claimed in claim 1, wherein said at least one essentially planar opposing field electrode is bounded by said outer electrode part and
   wherein said outer electrode part is solid and defines a truncated cone shaped bore.

4. An electrostatic opposing field spectrometer as claimed in claim 3, further comprising first and second essentially planar opposing field electrodes mounted at respective upper and lower edges of said truncated cone-shaped bore of said outer electrode part.

5. An electrostatic opposing field spectrometer as claimed in claim 3, wherein said truncated cone-shaped bore in said outer electrode part is circular.

6. An electrostatic opposing field spectrometer as claimed in claim 1, wherein said extraction electrode is planar.

7. An electrostatic opposing field spectrometer as claimed in claim 1, wherein said planar extraction electrode forms part of an extraction network.

8. An electrostatic opposing field spectrometer for undertaking measurements by means of an electron beam probe at various points on a test specimen, comprising: a substantially planar extraction electrode, a solid outer electrode portion forming a shaped bore therethrough, to define a smaller opening and a larger opening in said solid outer electrode portion, said smaller opening being in the direction of said extraction electrode, and at least one opposing field electrode mounted extending across said shaped bore.

9. An electrostatic opposing field spectrometer as claimed in claim 8, further comprising: an opposing field electrode extending across each of said smaller and larger openings in said outer electrode portion.

10. An electrostatic opposing field spectrometer as claimed in claim 9, wherein said opposing field electrodes are substantially planar.

11. An electrostatic opposing field spectrometer as claimed in claim 8, wherein said outer electrode portion defines a centrally-located circular truncated-conical bore.

* * * * *